United States Patent [19]

Kimura

[11] 4,420,870
[45] Dec. 20, 1983

[54] METHOD OF CONTROLLING CHANNEL LENGTH BY IMPLANTING THROUGH POLYCRYSTALLINE AND SINGLE CRYSTALLINE REGIONS FOLLOWED BY DIFFUSION ANNEAL

[75] Inventor: Minoru Kimura, Kawasaki, Japan

[73] Assignee: Tokyo Shibaura Denki Kabushiki Kaisha, Kawasaki, Japan

[21] Appl. No.: 304,913

[22] Filed: Sep. 23, 1981

[30] Foreign Application Priority Data

Oct. 9, 1980 [JP] Japan .............................. 55-141717

[51] Int. Cl.³ ...................... B01J 17/00; H01L 21/265
[52] U.S. Cl. .................................. 29/571; 29/576 B; 29/578; 148/1.5; 148/187; 357/91
[58] Field of Search .................. 148/1.5, 187; 29/571, 29/576 B, 578; 357/91

[56] References Cited

U.S. PATENT DOCUMENTS

| 3,615,934 | 10/1971 | Brower | 148/1.5 |
| 4,063,967 | 12/1977 | Graul et al. | 148/1.5 |
| 4,167,806 | 9/1979 | Kumurdjian | 29/580 |
| 4,216,573 | 8/1980 | Joshi | 29/571 |

FOREIGN PATENT DOCUMENTS 54-161282 6/1978 Japan .

OTHER PUBLICATIONS

Lau, S. S., J. Vac. Sci. Technol. 15(5) (1978) 1656.
Thompson et al., Radiation Effects, 52 (1980) 69–84.
Tsai et al., J. Appl. Phy. 50 (1979) 183.

Primary Examiner—Upendra Roy
Attorney, Agent, or Firm—Finnegan, Henderson, Farabow, Garrett & Dunner

[57] ABSTRACT

A method for manufacturing semiconductor devices containing at least one MOS field effect transistor (FET) so as to control the effective channel length thereof and prevent channel-shortening. A mask wider than the desired MOS FET channel is formed on the surface of a first single-crystalline silicon semiconductor region, and the lattice structure of the unmasked surface region, and the lattice structure of the unmasked surface portions thereof are randomized or disordered by silicon ion-implantation or by etching. After removal of the mask, epitaxial growth produces a polycrystalline region on the randomized regions and a second single-crystalline region on the previously masked region. An insulated gate electrode narrower than the single-crystalline region is formed centrally thereupon for serving as a mask during impurity implantation into the polycrystalline region and the portions of the second single-crystalline region adjacent thereto. In subsequent heat treatment impurity diffusion is slower in the second single-crystalline region that in the polycrystalline region, advantageously inhibiting lateral impurity diffusion from the second single-crystalline region into the channel underlying the gate electrode, thereby to control channel shortening, while at the same time permitting deep impurity diffusion in the polycrystalline regions for reducing resistance of the diffusion layer as a whole.

4 Claims, 13 Drawing Figures

F I G. 2A
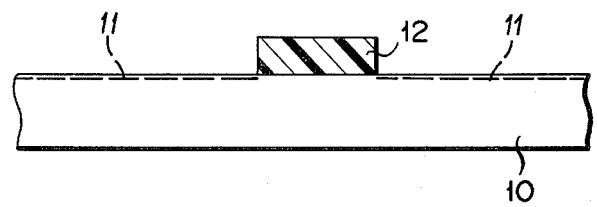
F I G. 2B
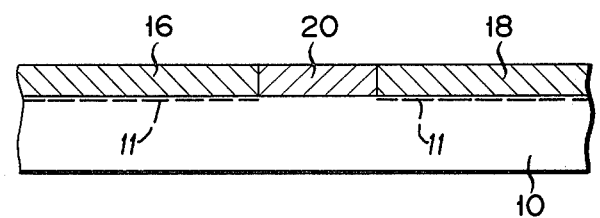
F I G. 3A
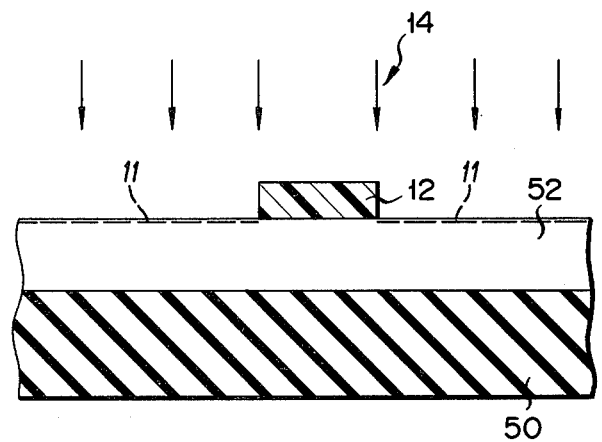
F I G. 3B
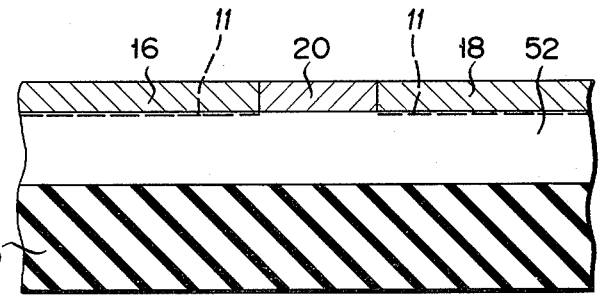

METHOD OF CONTROLLING CHANNEL LENGTH BY IMPLANTING THROUGH POLYCRYSTALLINE AND SINGLE CRYSTALLINE REGIONS FOLLOWED BY DIFFUSION ANNEAL

BACKGROUND OF THE INVENTION

This invention relates to a method for manufacturing a semiconductor device having field effect transistors (FET's).

Recently, MOS FET's of which a MOS integrated circuit is comprised are microminiaturized to improve the integration density of the MOS integrated circuit. In this case, in order to make the electrical characteristics of the MOS FET proper, the effective channel length of the MOS FET must be formed to be a predetermined length. It is particularly necessary to prevent the channel length from becoming shorter than a predetermined channel length (hereinafter referred to as "channel-shortening"). In order to prevent such channel-shortening, it is only necessary to shallowly form a diffusion layer which forms a source and drain region near the gate of the MOS FET. If a shallow diffusion layer is formed, however, the resistance of the diffusion layer is increased, providing a bar to a high-speed semiconductor device. One solution to such a problem is disclosed in Japanese Patent Disclosure (KOKAI) No. 54-161282 as proposed by the same inventor as that of this application. This invention is directed to solving the above-mentioned problem from another angle.

SUMMARY OF THE INVENTION

It is accordingly the object of this invention to provide a method for manufacturing a semiconductor device which can readily control the effective channel length of a MOS FET and prevent channel-shortening.

To attain the above-mentioned object, a semiconductor device is manufactured by the following method.

The crystallographical orientation (lattice structure) of an unmasked surface portion of a first single-crystalline silicon semiconductor region is randomized or disordered using a mask provided on the remaining surface portion of the first single-crystalline semiconductor region. The mask is wider than a channel to be formed on the surface of the first single-crystalline semiconductor region.

A second single-crystalline semiconductor region is epitaxially formed on the masked surface portion of the first single-crystalline semiconductor region and a polycrystalline semiconductor region is epitaxially formed on that unmasked portion of the first single-crystalline semiconductor region where the lattice structure was randomized or disordered.

A gate is formed on the second single-crystalline semiconductor region with an insulating film interposed therebetween, the gate being smaller in its width than that of the second single-crystalline semiconductor region.

A source and drain region are formed by introducing an impurity into the polycrystalline semiconductor region and into a portion of the second single-crystalline semiconductor region adjacent to the polycrystalline semiconductor region and subjecting the resultant semiconductor structure to heat treatment.

When the semiconductor device is so manufactured, channel-shortening can be prevented without lowering the operation speed.

BRIEF DESCRIPTION OF THE DRAWINGS

Other objects and advantages of this invention will become apparent from the following detailed description when taken in conjunction with the accompanying drawings, in which:

FIGS. 2A and 2B are cross-sectional views of a semiconductor substrate for explaining another method for manufacturing a semiconductor device according to this invention; and FIGS. 3A and 3B are cross-sectional views of a semiconductor substrate for explaining another method for manufacturing a semiconductor device according to this invention.

DETAILED DESCRIPTION OF THE PREFERRED EMBODIMENT

A method for manufacturing a semiconductor device of this invention will be explained below by referring to FIGS. 1A to 1I.

Figure 1A:
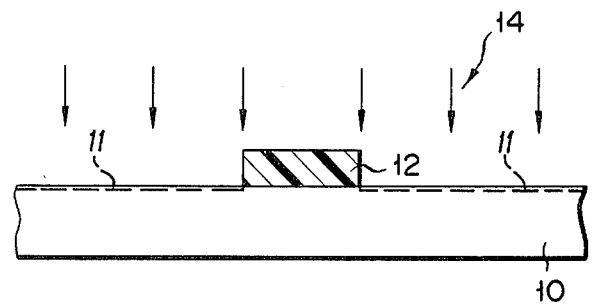
FIGS. 1A to 1I are cross-sectional views of a semiconductor substrate for explaining a method for manufacturing a semiconductor device according to this invention.
Figure 1B:
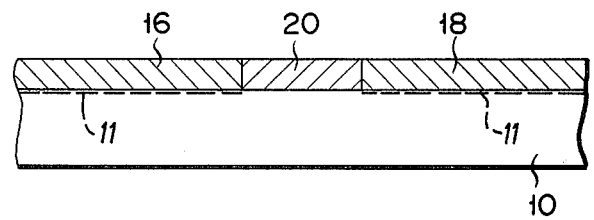

After a photoresist is coated on the surface of a single-crystalline silicon substrate 10 as shown in FIG. 1A, a resist pattern 12 is formed by a photoengraving process. Silicon 14 with a dose of $10^{14}$ to $10^{16}/cm^2$ is ion-implanted at an acceleration voltage of 30 to 60 KV in the exposed surface of the single-crystalline silicon substrate 10. As a result, the crystallographical orientation of the surface of the single-crystalline silicon substrate 10 is disturbed to form regions 11 containing randomized or disordered lattice structures in that a plurality of crystal faces therein are oriented at random. Then, the resist pattern 12 is removed, followed by an epitaxial growth as shown in FIG. 1B. Polycrystalline silicon regions 16, 18 are formed on regions 11 where the crystal faces are not oriented in a predetermined direction. A single-crystalline silicon region 20 is formed on the area previously masked with the resist pattern 12.

Figure 1C:
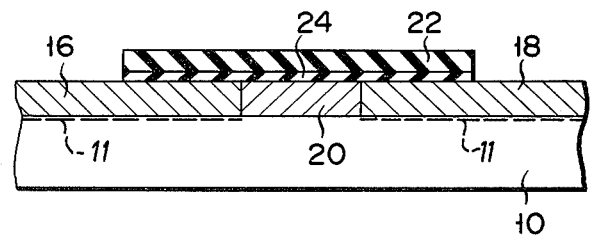

Then, the polycrystalline silicon regions 16, 18 and single-crystalline silicon region 20 are surface-treated by dry oxygen to form an approximately 600 Å-thick silicon oxide layer thereon, and an approximately 3,000 Å-thick silicon nitride layer is formed on the surface of the silicon oxide layer. As shown in FIG. 1C, the silicon nitride layer and silicon oxide layer are selectively etched to form a silicon oxide film 24 and silicon nitride film 22 in that order over the element formation area, silicon nitride film 22 functioning as an oxidation-resistant mask.

Figure 1D:
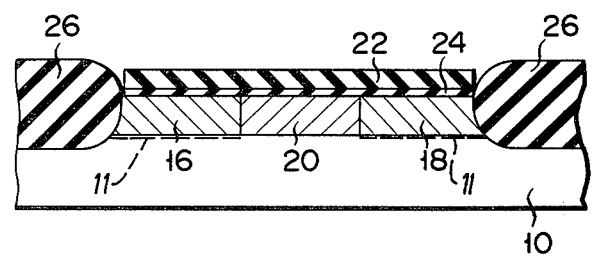
Figure 1E:
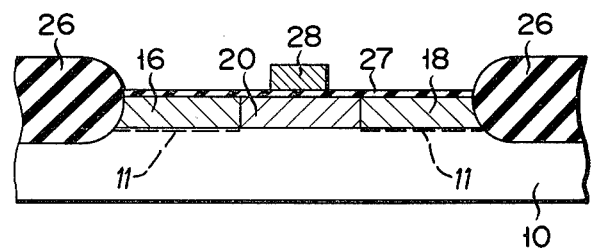

As shown in FIG. 1D, the resultant semiconductor structure is oxidized by steam to form an approximately 8,000 Å-thick field oxide film 26. Then, the silicon nitride film 22 and silicon oxide film 24 as the oxidation-resistant mask are removed. As shown in FIG. 1E, the semiconductor structure is dry-oxidized to form an approximately 500 Å-thick silicon oxide film 27 on the element formation region where the oxidation-resistant mask has been removed. An approximately 3,000 to 4,000 Å-thick polycrystalline silicon layer is deposited by a CVD method on the resultant semiconductor substrate. The polycrystalline silicon layer is selectively etched to form a gate electrode 28 over the substantially central portion of the single-crystalline silicon region 20, the gate electrode 28 being narrower in width than the width of the single-crystalline silicon region 20.

Figure 1F:
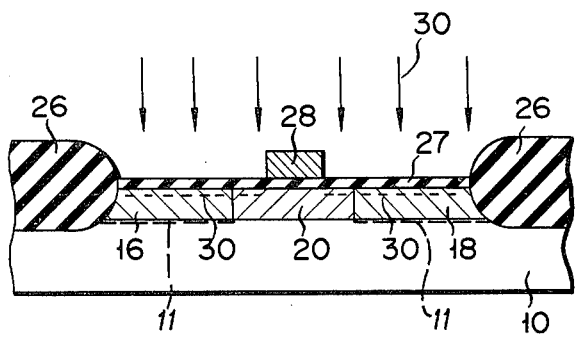
Figure 1G:
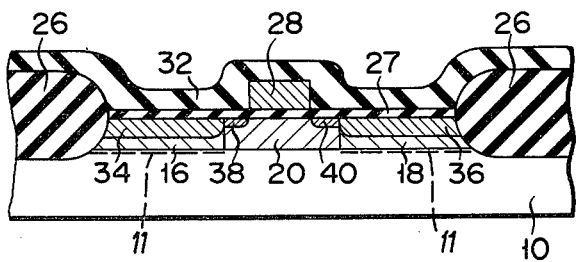

As shown in FIG. 1F, arsenic 30 (As) with a dose of 1 to $3 \times 10^{15}/cm^2$ is ion-implanted at an acceleration voltage of 50 KV in the element formation region with a gate electrode 28 as a mask. As shown in FIG. 1G a 3,000 Å-thick $SiO_2$ layer 32 is formed by the CVD method. In this process, arsenic ion-implanted in the element formation region is thermally diffused thereinto. Arsenic ion-implanted in the polycrystalline regions 16, 18 has a greater diffusion rate than does the arsenic ion-implanted in the single-crystalline region 20. Impurity diffusion regions 34 and 36 are formed in the polycrystalline silicon regions 16 and 18, respectively, the impurity diffusion regions 34 and 36 being deeper than impurity diffusion regions 38 and 40 formed in the single-crystalline region 20. Consequently the impurity diffusion regions 38, 40 in the single-crystalline silicon region 20 suffer less lateral impurity diffusion into the channel region to underly gate electrode 28. The resultant structure is heated for 20 minutes at 1,000° C., and phosphorus in the CVD-$SiO_2$ layer 32 is removed by a getter.

Figure 1H:
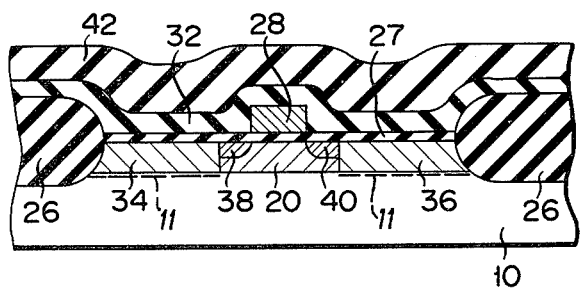
Figure 1I:
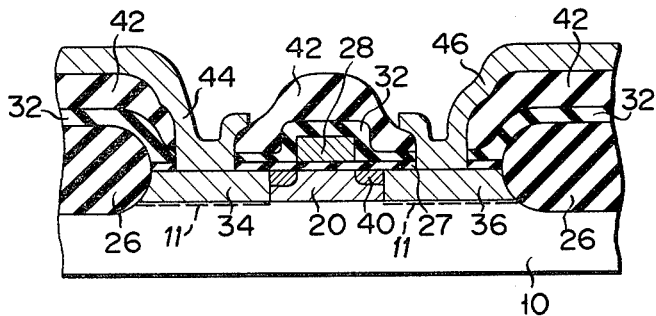

As shown in FIG. 1H, an 8,000 Å-thick BPSG (boron-doped phospho-silicate glass) layer 42 is deposited on the CVD-$SiO_2$ layer 32 and melted for 10 minutes at 950° C. In this case, the impurity regions 34, 36 formed in the polycrystalline silicon regions 16, 18 extend through the entire thickness of the polycrystalline silicon regions 16, 18. The impurity regions 38, 40 in the single-crystalline region 20 extend in the single-crystalline silicon regions 16, 18 to less depth than the impurity regions 34, 36. The first impurity region 34 in the polycrystalline region 16 and first impurity region 38 in the single-crystalline region 20 become a source region, and the second impurity region 36 in the polycrystalline region 18 and second impurity region 40 in the single-crystalline region 20 become a drain region. The BPSG layer 42, CVD-$SiO_2$ layer 32 and silicon oxide film 27 are selectively etched to provide holes reaching the first impurity region 34 in the polycrystalline silicon region 16 and second impurity region 36 in the polycrystalline silicon region 18 and aluminum is evaporated on the resultant structure. The aluminum layer is subjected to patterning, providing a source electrode 44 and drain electrode 46.

If the MOS transistor is formed in this way, the impurity region 38 (part of the source region in the single-crystalline region 20) and impurity region 40 (part of the drain region in the single-crystalline region 20) near the gate electrode 28 can be shallowly formed. Thus, it is easy to control the dimension of the effective channel length of the MOS transistor. It is also possible to prevent the shortening of the effective channel length. Moreover, the first impurity region 34 (i.e. the part of the source region in the polycrystalline region 16) and second impurity region 36 (i.e. the part of the drain region in the polycrystalline region 18) can be deeply formed. This permits a decrease in the resistance of the source region and drain region, and a realization of a high-speed semiconductor device.

Another method for forming polycrystalline silicon region will be explained below by referring to FIGS. 2A and 2B.

After a photoresist is coated on the surface of a single-crystalline silicon substrate 10, a resist pattern 12 is formed by a photoengraving process as shown in FIG. 2A. The exposed surface of the single-crystalline silicon subbstrate 10 is anisotropically etched, for example, with a potassium hydroxide (KOH) solution and hydrazine solution. In this case, crystal faces with various crystallographical directions are formed on the exposed surface of the single-crystalline silicon substrate 10, producing regions 11 containing randomized or disordered lattice structures.

The removal of the resist pattern 12 and epitaxial growth are effected as shown in FIG. 2B. Polycrystalline silicon regions 16, 18 are formed on regions 11 where the crystal faces are oriented at random, i.e. not formed in a predetermined direction, and a single-crystalline silicon region 20 is formed on the area previously masked with the resist pattern 12. The subsequent steps are the same as those shown in FIGS. 1C to 1I.

Although in the above-mentioned embodiment arsenic is used as an impurity for forming a source and drain region, antimony may be used instead. While this invention has been explained in connection with an N-channel transistor, a P-channel transistor may be formed. This invention can be applied equally to a complementary MOS transistor.

Another method for the manufacture of a semiconductor device will be explained by referring to FIGS. 3A and 3B. As shown in FIG. 3A, a semiconductor region 52 made of a single-crystalline silicon is formed on an insulating substrate 50 of, for example, sapphire. After a photoresist is coated on the surface of the semiconductor region 52, a resist pattern 12 is formed by a photoengraving process. Silicon 14 with a dose of $10^{14}$ to $10^{16}/cm^2$ is ion-implanted at an acceleration voltage of 30 to 60 KV in the exposed semiconductor region 52. As a result, the crystallographical orientation on the surface of the semiconductor region 52 is distributed to form regions 11 containing randomize or disordered lattice structures in that a plurality of crystal faces therein are oriented at random. As shown in FIG. 3B resist pattern 12 is removed and epitaxial layer growth is performed. In this case, polycrystalline silicon regions 16, 18 are formed on region 11, the area whose crystal faces are oriented at random, i.e. not formed in a predetermined direction, and a single-crystalline silicon region 20 is formed on the area previously masked with the resist pattern 12. The subsequent steps are the same as those shown in FIGS. 1C and 1I.

It is needless to say that as the gate 28 silicide or the other metal may be applied.

After a thermal oxidation film is formed on the surface of the single-crystalline silicon substrate 10 or the semiconductor region 52 formed of a single-crystalline silicon, an epitaxial growth may be effected on the surface of the resultant structure to form polycrystalline silicon regions 16, 18. However, where a source and a drain region are formed to extend through the polycrystalline silicon regions 16, 18 and reach the single-crystalline silicon substrate 10 or the semiconductor region 52 for further lowering the resistances of the source and drain regions, there is an inconvenience that the above-mentioned thermal oxidation film provides a barrier to the impurity diffusion.

What is claimed is:

1. A method for manufacturing a semiconductor device, comprising the steps of:
   a. randomizing or disordering the lattice structure of an unmasked surface portion of a first single-crystalline silicon semiconductor region using a mask provided on the remaining surface portion of said first single-crystalline semiconductor region, said mask being wider than a channel to be formed on the surface of the first single-crystalline semiconductor region;

b. epitaxially forming a second single-crystalline semiconductor region on the masked portion of the first single-crystalline semiconductor region and a polycrystalline semiconductor region on that unmasked portion of the first single-crystalline semiconductor region where the lattice structure is randomized or disordered;

c. forming a gate on the second single-crystalline semiconductor region with an insulating film interposed therebetween, the gate being smaller in its width than that of the second single-crystalline semiconductor region; and d. forming a source region and a drain region by introducing an impurity into the polycrystalline semiconductor region and into the portion of the second single-crystalline semiconductor region adjacent to the polycrystalline semiconductor region and subjecting the resultant semiconductor structure to heat treatment.

2. The method according to claim 1, wherein said step of randomizing or disordering the lattice structure is effected by ion-implanting atoms of the same type as those of said first single-crystalline semiconductor region.

3. The method according to claim 1, wherein said step of randomizing or disordering the lattice structure is effected by etching said first single-crystalline semiconductor region.

4. The method according to any one of claims 1 to 3, wherein said first single-crystalline semiconductor region is formed on an insulating substrate.

* * * * *